United States Patent
Nagai et al.

(10) Patent No.: US 6,757,174 B2
(45) Date of Patent: Jun. 29, 2004

(54) SWITCHING POWER-SUPPLY MODULE

(75) Inventors: Jun Nagai, Sagamihara (JP); Yoshihiro Matsumoto, Sagamihara (JP); Takayoshi Nishiyama, Yokohama (JP); Tadahiko Matsumoto, Yokohama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/105,777

(22) Filed: Mar. 25, 2002

(65) Prior Publication Data

US 2002/0153872 A1 Oct. 24, 2002

(30) Foreign Application Priority Data

Apr. 18, 2001 (JP) ........................................ 2001-119993

(51) Int. Cl.[7] ............................ H05K 1/03; H01F 21/24
(52) U.S. Cl. ........................ 361/767; 361/739; 336/200; 336/65
(58) Field of Search ................................ 323/255, 282, 323/283, 284, 355; 336/65, 192, 200, 223, 225, 96, 97, 208, 198; 361/405, 718, 736, 743, 767, 739

(56) References Cited

U.S. PATENT DOCUMENTS

| 4,975,671 A | * | 12/1990 | Dirks | 336/65 |
| 5,034,854 A | * | 7/1991 | Matsumura et al. | 361/396 |
| 5,565,837 A | * | 10/1996 | Godek et al. | 336/232 |
| 6,378,774 B1 | * | 4/2002 | Emori et al. | 235/492 |
| 6,496,382 B1 | * | 12/2002 | Ferguson et al. | 361/767 |

FOREIGN PATENT DOCUMENTS

| JP | 56-007325 | 6/1979 |
| JP | 6-066291 | 9/1994 |

\* cited by examiner

*Primary Examiner*—Rajnikant B. Patel
(74) *Attorney, Agent, or Firm*—Keating & Bennett, LLP

(57) ABSTRACT

A switching power-supply module includes a coil pattern of a transformer or an inductor disposed on a substrate. A portion of the coil pattern projects into an edge portion of the substrate. A plurality of terminals are arranged in the substrate edge portion so that they do not touch the coil pattern. The substrate edge portion is soaked in molten solder in the production procedure in order to fix the terminals onto the substrate with solder after components are solder-connected on the substrate. For this reason, the components were previously prohibited from being mounted in the substrate edge portion, and this region has been previously considered to be a dead space. However, in the present invention, since a portion of the coil pattern projects into the substrate edge portion, dead space is minimized, and the size of the substrate, that is, of the switching power supply module is greatly reduced.

12 Claims, 5 Drawing Sheets

SWITCHING POWER-SUPPLY MODULE

BACKGROUND OF THE INVENTION

1. Field of the Invention

The present invention relates to a switching power-supply module in a DC—DC converter or suitable apparatus.

2. Description of the Related Art

FIG. 3 schematically shows an example of a switching power-supply module. This switching power-supply module 1 includes a substrate 2, a coil device 3, circuit components 4 other than the coil device 3, such as an IC chip, a capacitor element, and a semiconductor element, and a plurality of terminals 5.

In the switching power-supply module 1, a circuit pattern (not shown) is formed on the substrate 2, and the circuit components 4 are surface-mounted on one of or both of the front and back surfaces of the substrate 2 with solder. The circuit pattern, the circuit components 4, and the coil device 3 constitute a switching power-supply circuit in a DC—DC converter.

The coil device 3 is a transformer or an inductor which constitutes the switching power-supply circuit, and is produced by using the substrate 2. That is, the substrate 2 is provided with a coil pattern 6 which constitutes the coil device 3, and core-leg insertion holes 7 (7a, 7b, and 7c) formed in the substrate 2 adjacent to the coil pattern 6. Cores 8 are placed on both the front and back surfaces of the substrate 2, leg portions of the cores 8 are inserted in the core-leg insertion holes 7, and a portion of the coil pattern 6 is clamped by the cores 8 from both the front and back sides of the substrate 2, thereby constructing the coil device 3. In FIG. 3, a coupling member 9 combines and mounts a pair of cores 8 onto the substrate 2.

A plurality of terminals 5 are arranged at a fixed pitch in each of a pair of opposing edge portions of the substrate 2. The terminals 5 include a terminal functioning as an input terminal which supplies power from an external circuit to the switching power-supply circuit, a terminal functioning as an output terminal which directs the output of the switching power-supply circuit to the outside, and a terminal functioning as a control terminal which supplies a control signal for externally controlling the switching power-supply circuit.

On a mount board 10 on which such a switching power-supply module 1 is mounted, lands 11 are arranged so as to correspond to positions of the terminals 5. By solder-connecting the lands 11 and the leading ends of the corresponding terminals 5, the switching power-supply module 1 can be surface-mounted on a mount region Z of the mount board 10.

In a procedure for manufacturing such a switching power-supply module 1, first, a circuit pattern is formed on the substrate 2, and the coil device 3 and the circuit components 4 are mounted on the substrate 2. A plurality of terminals 5 are then arranged on the edge of the substrate 2. In this case, for example, a terminal-arranging member 15 shown in FIG. 4A is used. The terminal-arranging member 15 includes a plurality of terminals 5 arranged at a fixed pitch P, and allows the terminals 5 to be mounted together on the edge of the substrate 2.

FIG. 4B is a right-side view of the terminal-arranging member 15 shown in FIG. 4A. In the example shown in FIGS. 4A and 4B, a clip 16 is provided at one end of each terminal 5. The terminal 5 is mounted on the substrate 2 by clamping the substrate 2 by the clip 16 from both the front and back sides. After the terminals 5 are mounted on the substrate 2 by the clips 16, the terminal-arranging member 15 is cut at the base sides of the terminals 5 along the cutting line L so as to separate the terminals 5.

After the mounting of such terminals 5 is completed, the edge of the substrate 2 where the terminals 5 are arranged is soaked in molten solder 13 in a solder bath 12, as shown in FIG. 5. Solder thereby adheres, for example, around the clips 16 of the terminals 5. The terminals 5 and the substrate 2 are solder-connected by cooling the solder.

The switching power-supply module 1 can be produced through such a manufacturing procedure.

Such a switching power-supply module 1 has been required to be reduced in size. In order to meet the requirement, various techniques have been proposed. However, the switching power-supply module 1 is required to be further reduced in size, and a new technique is needed to meet this requirement.

SUMMARY OF THE INVENTION

In order to overcome the problems described above, preferred embodiments of the present invention provide a switching power-supply module that is easily reduced in size.

According to a preferred embodiment of the present invention, a switching power-supply module includes a substrate on which a switching power-supply circuit is provided, and a plurality of terminals arranged on an edge portion of the substrate, wherein a coil pattern is disposed on the substrate, a transformer or an inductor is mounted on the coil pattern with a core fitted in a hole formed in the substrate, the edge portion of the substrate on which the terminals are arranged is a prohibited component-mounting region where surface-mounting of a solder-connected component is prohibited, a portion of the coil pattern projects into the prohibited component-mounting region, and the terminals are arranged on the edge portion of the substrate so that they do not touch the coil pattern.

Preferably, the prohibited component-mounting region is soaked or dipped in molten solder in order to solder the terminals placed on the substrate.

Preferably, the terminals are arranged on the edge portion of the substrate at a fixed pitch so that a forming region of the coil pattern interrupts the arrangement of the terminals.

Preferably, a resist layer covers at least a portion of the coil pattern.

Conventionally, on the edge portion of the substrate on which the terminals are placed, surface-mounting of solder-connected components (components to be mounted on the substrate with solder) is prohibited. This is because such an edge portion having the terminals is sometimes soaked in molten solder in order to solder the terminals. If solder-connected components are surface-mounted in this region, solder between the solder-connected components and the substrate melts when soaked in molten solder, and the solder-connected components fall off the substrate. It has been generally considered prior to the development of the present invention that the prohibited component-mounting region is a dead space in which any component of the switching power-supply circuit cannot be formed or disposed.

When the switching power-supply circuit includes a transformer and an inductor, a coil pattern is sometimes provided on the substrate, and the transformer and the inductor are defined by the coil pattern. Since the coil pattern is a component of the circuit, it is arranged on the substrate so as not to touch the prohibited component-mounting region.

In contrast, the present inventor has discovered that the coil pattern is prevented from being damaged by molten solder, for example, by a resist layer formed thereon, and has made the preferred embodiments of the present invention which is superior enough to replace the conventional ideas and devices.

That is, in preferred embodiments of the present invention, a portion of the coil pattern is arranged so as to project into the prohibited component-mounting region, and a plurality of terminals are arranged on the edge portion of the substrate so that they do not touch the coil pattern. Since this characteristic structure allows a portion of the coil pattern to be located in the region which has been previously considered to be a dead space, it is possible to minimize the dead space, and to further reduce the size of the switching power-supply module.

Further elements, characteristics, features, and advantages of the present invention will become apparent from the following description of the preferred embodiments with reference to the attached drawings.

DETAILED DESCRIPTION OF PREFERRED EMBODIMENTS

Preferred embodiments of the present invention will described below with reference to the attached drawings.

Figure 1:
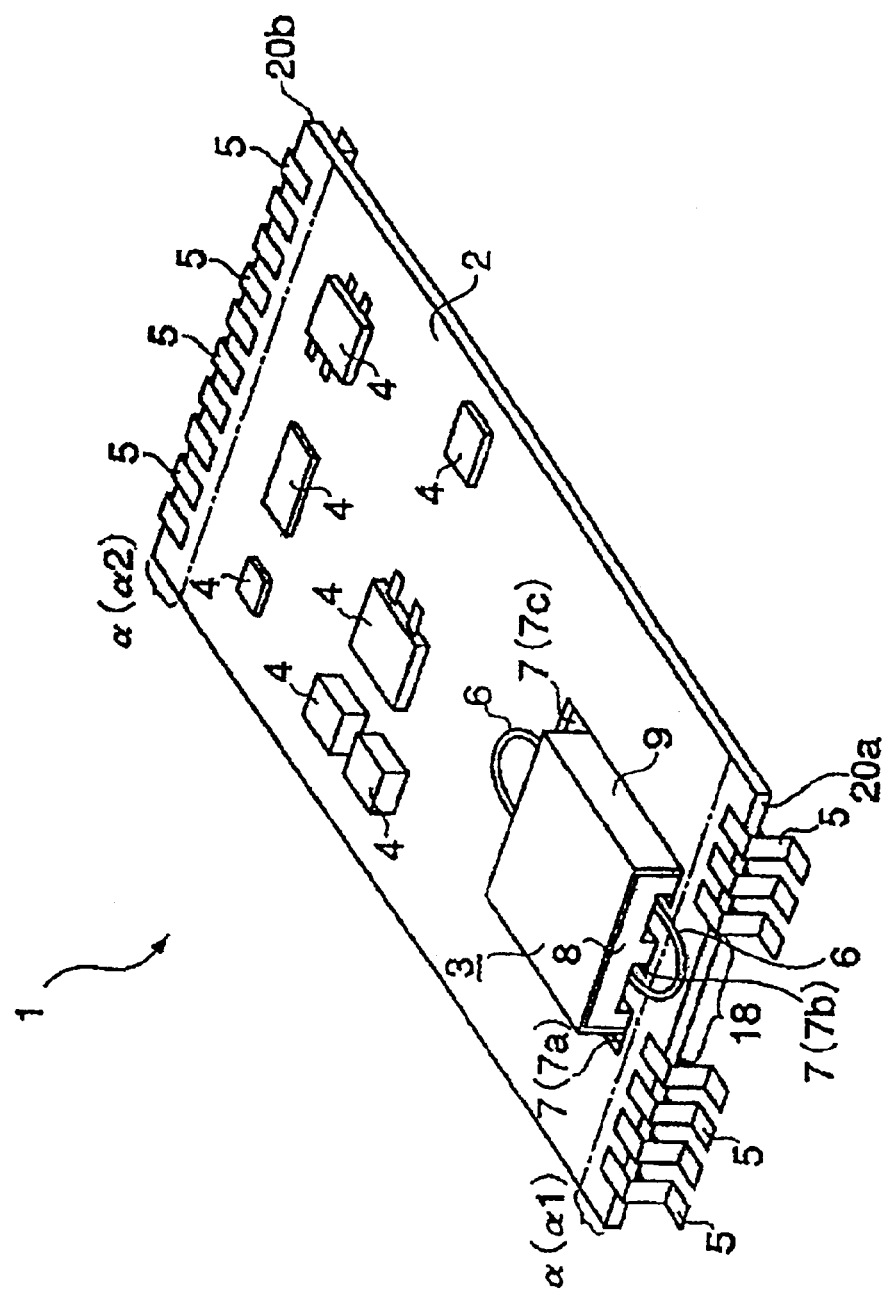
FIG. 1 is a schematic perspective view of a switching power-supply module according to a preferred embodiment of the present invention.
Figure 3:
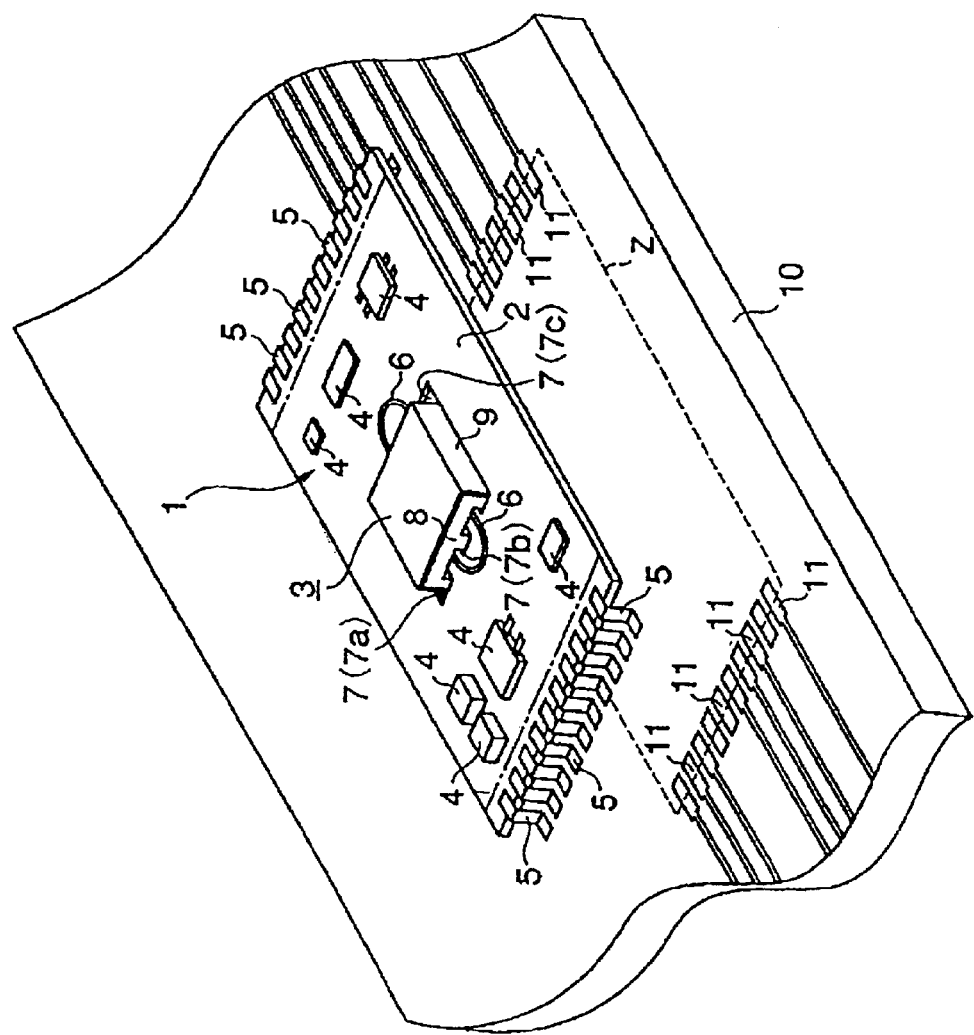
FIG. 3 is a model view showing a related art switching power-supply module and a mount board.

FIG. 1 is a schematic perspective view of a switching power-supply module according to a preferred embodiment of the present invention. In the following description of the preferred embodiments, the same components as those in the switching power-supply module 1 shown in FIG. 3 are denoted by the same numerals, and repetitive descriptions thereof are omitted. A switching power-supply circuit constituted by a coil device 3, circuit components 4, and a circuit pattern (not shown) may have various circuit configurations. Any of the circuit configurations may be adopted in the preferred embodiments of the present invention, and a description thereof is omitted.

In the present preferred embodiment, a plurality of terminals 5 are arranged along a pair of opposing substrate edges 20a and 20b of a substrate 2. Substrate edge portions $\alpha 1$ and $\alpha 2$ in which the terminals 5 are placed are regions in which mounting of the circuit components 4 defining solder-connected components is prohibited (prohibited component-mounting regions) for the above-described reason.

In one of the prohibited component-mounting regions $\alpha 1$, a plurality of terminals 5 are arranged along the substrate edge 20a at a fixed pitch on both sides of an interrupting portion 18. A portion of a coil pattern 6 of the coil device 3 enters in the interrupting portion 18 in the arranged terminals 5.

In other words, a portion of the coil pattern 6 of the coil device 3 projects into the prohibited component-mounting region $\alpha 1$, and the terminals 5 are arranged along the substrate edge 20a so that they do not touch the coil pattern 6.

Figure 5:
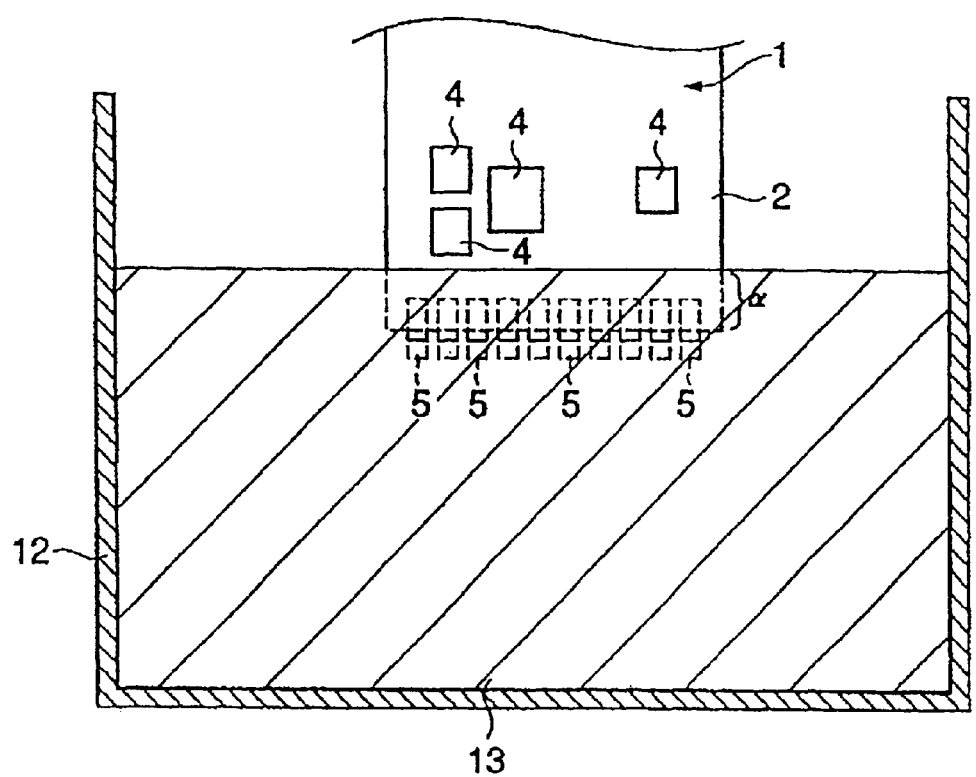
FIG. 5 is a schematic view showing a state in which the terminals disposed on the edge of the substrate are soaked in molten solder so as to be soldered in a production procedure for the switching power-supply module.

In the manufacturing procedure, the prohibited component-mounting regions $\alpha 1$ and $\alpha 2$ are soaked or dipped in molten solder 13 in order to solder-connect the substrate 2 and the terminals 5, as shown in FIG. 5. For this reason, a portion of the coil pattern 6 is also soaked in the molten solder 13. In this preferred embodiment, since a resist layer is disposed on the coil pattern 6, the coil pattern 6 is prevented from being adversely affected, for example, being damaged due to the soaking in the molten solder 13.

In this preferred embodiment, as described above, the interrupting portion 18 which interrupts the array of the terminals 5 is formed as a region, where the coil pattern 6 is formed, in the prohibited component-mounting region $\alpha 1$. For this reason, the number of terminals 5 is less than that in the related art. Some of a plurality of terminals 5 are not used to electrically connect the switching power-supply circuit and an external circuit in the related art. In the present preferred embodiment of the present invention, such terminals 5 which do not have an electric function are omitted so as to form the interrupting portion 18.

The position of the interrupting portion 18 may be arbitrarily determined in accordance with the position of the coil device 3 which is defined by the circuit configuration of the switching power-supply circuit and the like. The size of the interrupting portion 18 may also be arbitrarily determined in consideration of various factors, such as the size and shape of the coil pattern 6 of the coil device 3 and the number of the terminals 5 having an electrical function.

Figure 4:
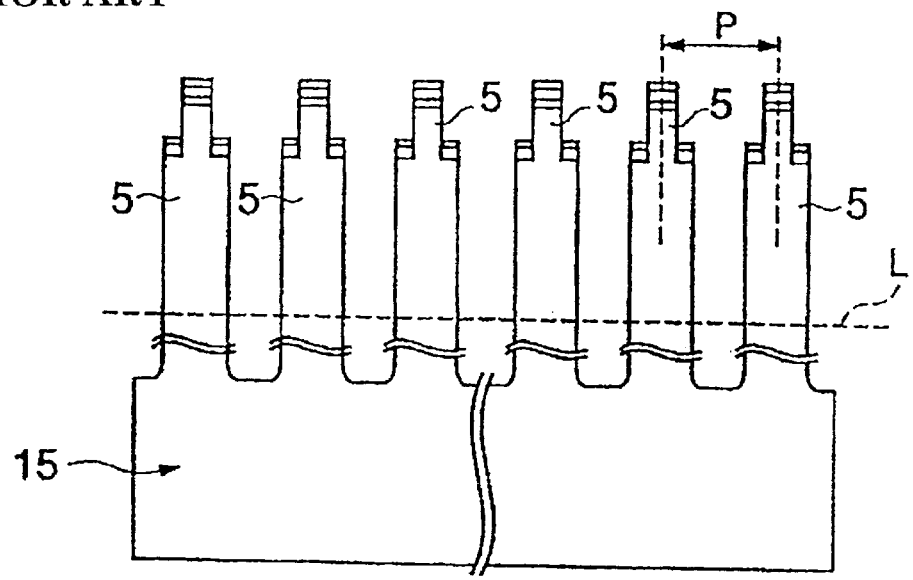
FIGS. 4A and 4B are explanatory views showing a state of terminals before being mounted on a substrate of the switching power-supply module.
Figure 4:
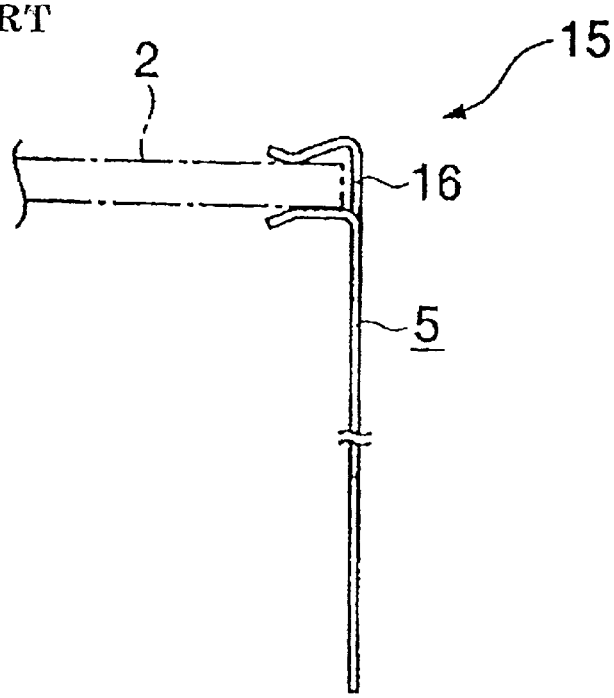

In order to arrange a plurality of terminals 5 along the substrate edge 20a on both sides of the interrupting portion 18 in the production procedure, for example, terminals 5 positioned corresponding to the formation region of the coil pattern 6 are removed from a terminal-arranging member 15 (see FIG. 4), and remaining terminals 5 are mounted together on the edge portion $\alpha 1$ of the substrate 2 by using the terminal-arranging member 15.

In the present preferred embodiment of the present invention, the interrupting portion 18 is located in the prohibited component-mounting region $\alpha 1$, and a portion of the coil pattern 6 of the coil device 3 projects into the interrupting portion 18, and therefore, dead space can be minimized. This greatly reduces the size of the substrate 2, that is, of the switching power-supply module 1.

While the present invention has been described with reference to what is presently considered to be preferred embodiments, it is to be understood that the invention is not limited to the disclosed preferred embodiments. On the contrary, the present invention is intended to cover various modifications and equivalent arrangements included within the spirit and scope of the appended claims.

Figure 2:
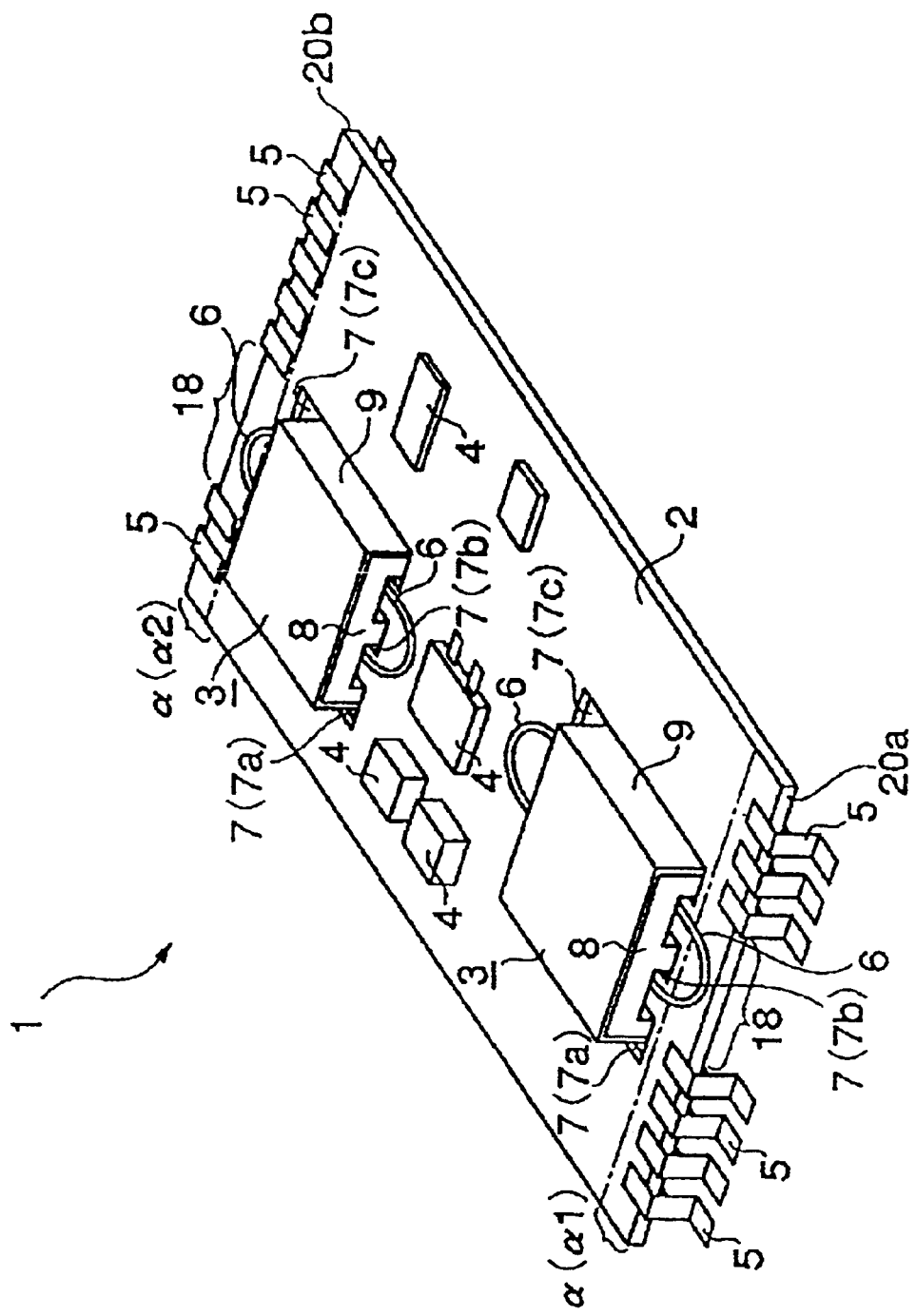
FIG. 2 is a schematic perspective view of a switching power-supply module according to another preferred embodiment of the present invention.

For example, while a portion of the coil pattern 6 projects into one of the prohibited component-mounting regions $\alpha 1$ and $\alpha 2$ in the above-described preferred embodiments, when a plurality of coil patterns 6 are formed on the substrate 2, as shown in FIG. 2, they may partially project into the prohibited component-mounting regions $\alpha 1$ and $\alpha 2$, respectively.

While a plurality of terminals 5 are arranged in each of the opposing edge portions α1 and α2 of the substrate 2 in the above-described preferred embodiments, for example, a plurality of terminals 5 may be arranged in each of the four edge portions of the substrate 2. In this case, all of the four edge portions of the substrate 2 define prohibited component-mounting regions α. By causing a portion of the coil pattern 6 to project into at least one of the prohibited component-mounting regions α, the size of the switching power-supply module 1 is greatly reduced.

While the terminals 5 are mounted on the substrate 2 by using clips 16 shown in FIG. 4B, they may have other various shapes.

While the pitch of the terminals 5 is fixed in the above-described preferred embodiments, the terminals 5 can be arranged in a manner other than the fixed pitch. For example, the pitch of the terminals 5 may be arbitrarily changed in consideration of the mounting relationship between the switching power-supply module 1 and the mount board 10.

In the present invention, a portion of the coil pattern projects into the prohibited component-mounting region located in the substrate edge portion, and a plurality of terminals are arranged in the substrate edge portion so as not to touch the coil pattern. Since a portion of the coil pattern is placed in the portion which was a dead space in the related art, the dead space can be reduced. This makes it possible to further reduce the size of the substrate, that is, of the switching power-supply module.

It had been considered in the past that none of the components which constitute the switching-power-supply circuit could be located in the prohibited component-mounting region which is soaked in molten solder in order to solder the terminals arranged on the substrate. In contrast, the present invention provides a superior structure in which a portion of the coil pattern of a transformer or an inductor which is a component of the switching power-supply circuit is located in the prohibited component-mounting region. This minimizes the dead space and greatly reduces the size of the switching power-supply module.

By forming a resist layer on the coil pattern, the coil pattern can be prevented from being damaged even more, even when soaked in molten solder.

In a case in which a plurality of terminals are arranged at a fixed pitch in the substrate edge portion, a switching power-supply module can be produced by using, for example, a component which has been previously popularly used (for example, an integral component including a plurality of terminals arranged at a fixed pitch).

What is claimed is:

1. A switching power-supply module comprising:
    a substrate;
    a switching power-supply circuit disposed on the substrate; and
    a plurality of terminals arranged on an edge portion of said substrate;
    wherein a coil pattern is disposed on said substrate, a transformer or an inductor is mounted on said coil pattern and includes a core fitted in a hole formed in said substrate, said edge portion of said substrate on which said terminals are arranged defines a prohibited component-mounting region where surface-mounting of a solder-connected component is prohibited, a portion of said coil pattern projects into said prohibited component-mounting region, and said terminals are arranged in said edge portion of said substrate so that said terminals do not touch said coil pattern.

2. A switching power-supply module according to claim 1, wherein said prohibited component-mounting region is covered by solder in order to solder said terminals placed on said substrate.

3. A switching power-supply module according to claim 1, wherein said terminals are arranged in said edge portion of said substrate at a fixed pitch so that a forming region of said coil pattern interrupts the arrangement of said terminals.

4. A switching power-supply module comprising:
    a substrate;
    a switching power-supply circuit disposed on the substrate; and
    a plurality of terminals arranged on an edge portion of said substrate;
    wherein a coil pattern is disposed on said substrate, a transformer or an inductor is mounted on said coil pattern and includes a core fitted in a hole formed in said substrate, said edge portion of said substrate on which said terminals are arranged defines a prohibited component-mounting region where surface-mounting of a solder-connected component is prohibited, a portion of said coil pattern projects into said prohibited component-mounting region, and said terminals are arranged in said edge portion of said substrate so that said terminals do not touch said coil pattern; and
    a resist layer that covers at least a portion of said coil pattern.

5. A switching power-supply module according to claim 4, wherein said resist layer covering said portion of said coil pattern is covered by solder.

6. A switching power-supply module according to claim 1, wherein said terminals are arranged in said edge portion of said substrate at a pitch that is determined based on a mounting relationship between the switching power-supply circuit and said substrate.

7. A switching power-supply module according to claim 1, further comprising a plurality of coil patterns disposed on the substrate and arranged such that a portion of each of the coil patterns projects into prohibited component-mounting regions defined at each end of the substrate.

8. A switching power-supply module according to claim 1, wherein the plurality of terminals are arranged on two opposing edge portions of said substrate.

9. A switching power-supply module according to claim 8, wherein said two opposing edge portions of said substrate on which said terminals are arranged define prohibited component-mounting regions where surface-mounting of a solder-connected component is prohibited.

10. A switching power-supply module according to claim 9, further comprising a plurality of coil patterns disposed on the substrate and arranged such that a portion of each of the coil patterns projects into one of the prohibited component-mounting regions defined at the two opposite ends of the substrate.

11. A switching power-supply module according to claim 1, wherein the plurality of terminals are arranged on each of four opposing edge portions of said substrate.

12. A switching power-supply module according to claim 11, wherein said four opposing edge portions of said substrate on which said terminals are arranged define prohibited component-mounting regions where surface-mounting of a solder-connected component is prohibited.

* * * * *